(12) United States Patent
Zhou et al.

(10) Patent No.: US 9,655,273 B2
(45) Date of Patent: May 16, 2017

(54) SERVER CASE

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Dun-Jun Zhou, Wuhan (CN); Rong-Rong Song, Wuhan (CN)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 78 days.

(21) Appl. No.: 14/694,849

(22) Filed: Apr. 23, 2015

(65) Prior Publication Data

US 2016/0278223 A1    Sep. 22, 2016

(30) Foreign Application Priority Data

Mar. 18, 2015 (CN) .......................... 2015 1 0118480

(51) Int. Cl.
| | | |
|---|---|---|
| *A47B 81/00* | (2006.01) | |
| *A47B 97/00* | (2006.01) | |
| *H05K 7/14* | (2006.01) | |
| *H05K 5/02* | (2006.01) | |
| *G06F 1/18* | (2006.01) | |
| *G06F 1/16* | (2006.01) | |

(52) U.S. Cl.
CPC ......... *H05K 7/1487* (2013.01); *H05K 5/0226* (2013.01); *G06F 1/16* (2013.01); *G06F 1/181* (2013.01)

(58) Field of Classification Search
CPC .. H05K 5/0204; H05K 5/0217; H05K 5/0221; H05K 5/0226; H05K 5/0239; H05K 5/03; H05K 7/18; G06F 1/16; G06F 1/18; G06F 1/181; G06F 1/182; Y10T 16/544; Y10T 16/5445; Y10T 16/5448; E05D 3/18

See application file for complete search history.

(56) References Cited

U.S. PATENT DOCUMENTS

| | | | | |
|---|---|---|---|---|
| 1,302,178 | A * | 4/1919 | Korb .......................... | E05D 3/18 16/360 |
| 2,249,403 | A * | 7/1941 | Stollsteimer ............. | A47B 5/04 16/357 |
| 6,052,276 | A * | 4/2000 | Do ......................... | G06F 13/409 361/679.4 |
| 6,737,577 | B1 * | 5/2004 | Liao ......................... | G06F 1/181 174/50 |
| 6,819,551 | B2 * | 11/2004 | Chen ....................... | G06F 1/181 312/223.1 |

(Continued)

*Primary Examiner* — Daniel J Troy
*Assistant Examiner* — Andres F Gallego
(74) *Attorney, Agent, or Firm* — Steven Reiss

(57) ABSTRACT

A server case includes a shell defining an opening, a door, and a connection member. The connection member includes a sliding portion and a rotation portion. The sliding portion is slidable and connected to the door. The rotation portion is slidably engaged with the shell. The sliding portion slides on the door to drive the rotation portion to slide in the shell to make the door move from a position where an angle between the door and the opening is greater than 90 degrees to shield the opening.

20 Claims, 10 Drawing Sheets

(56) References Cited

U.S. PATENT DOCUMENTS

| | | | | |
|---|---|---|---|---|
| 7,876,551 B2 * | 1/2011 | Wang | ..................... | E05D 3/18 |
| | | | | 16/362 |
| 2009/0241292 A1 * | 10/2009 | Wang | ..................... | E05D 3/183 |
| | | | | 16/387 |
| 2015/0351269 A1 * | 12/2015 | Huang | ................ | G06F 1/1601 |
| | | | | 174/66 |
| 2016/0109902 A1 * | 4/2016 | Wang | ..................... | G06F 1/183 |
| | | | | 312/223.1 |

* cited by examiner

SERVER CASE

CROSS-REFERENCE TO RELATED APPLICATIONS

This application claims priority to Chinese Patent Application No. 201510118480.6, filed on Mar. 18, 2015, the contents of which are incorporated by reference herein.

FIELD

The subject matter herein relates to a server case

BACKGROUND

Server cases include a shell and door. The shell defines an opening. The door is attached to the shell through several bolts to shield the opening. When components in the shell need to be checked or repaired, the door must be disassembled.

BRIEF DESCRIPTION OF THE DRAWINGS

Implementations of the present technology will now be described, by way of example only, with reference to the attached figures.

DETAILED DESCRIPTION

Figure 1:
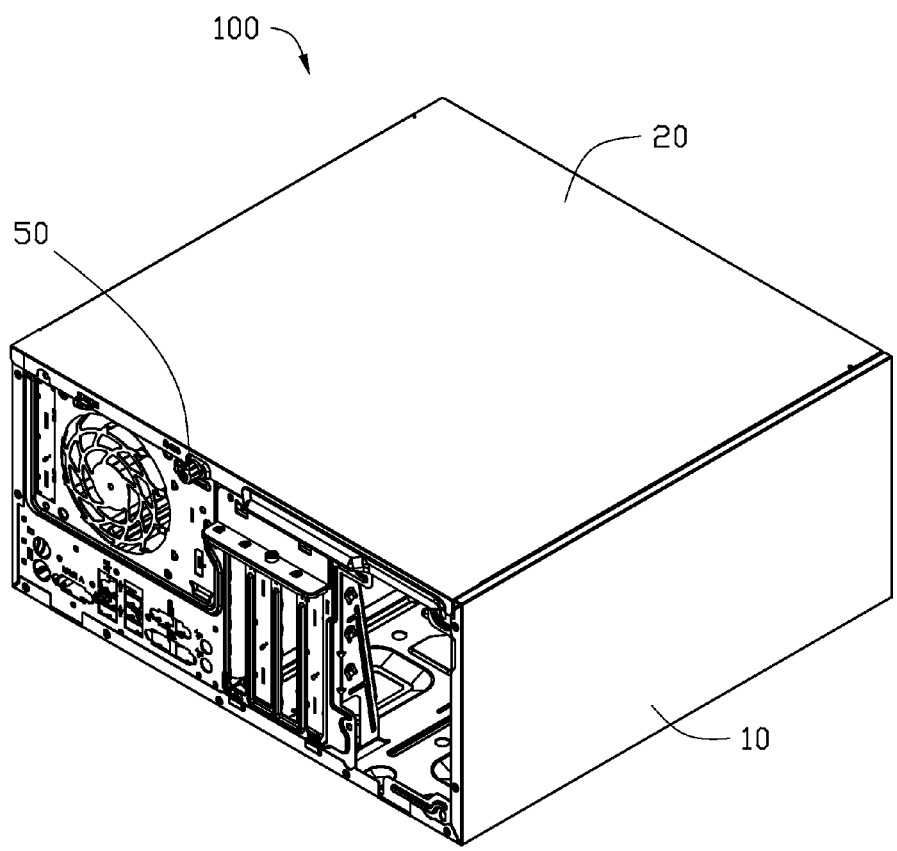
FIG. 1 is an isometric view of a server case.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "comprising" means "including, but not necessarily limited to"; it specifically indicates open-ended inclusion or membership in a so-described combination, group, series, and the like.

Figure 2:
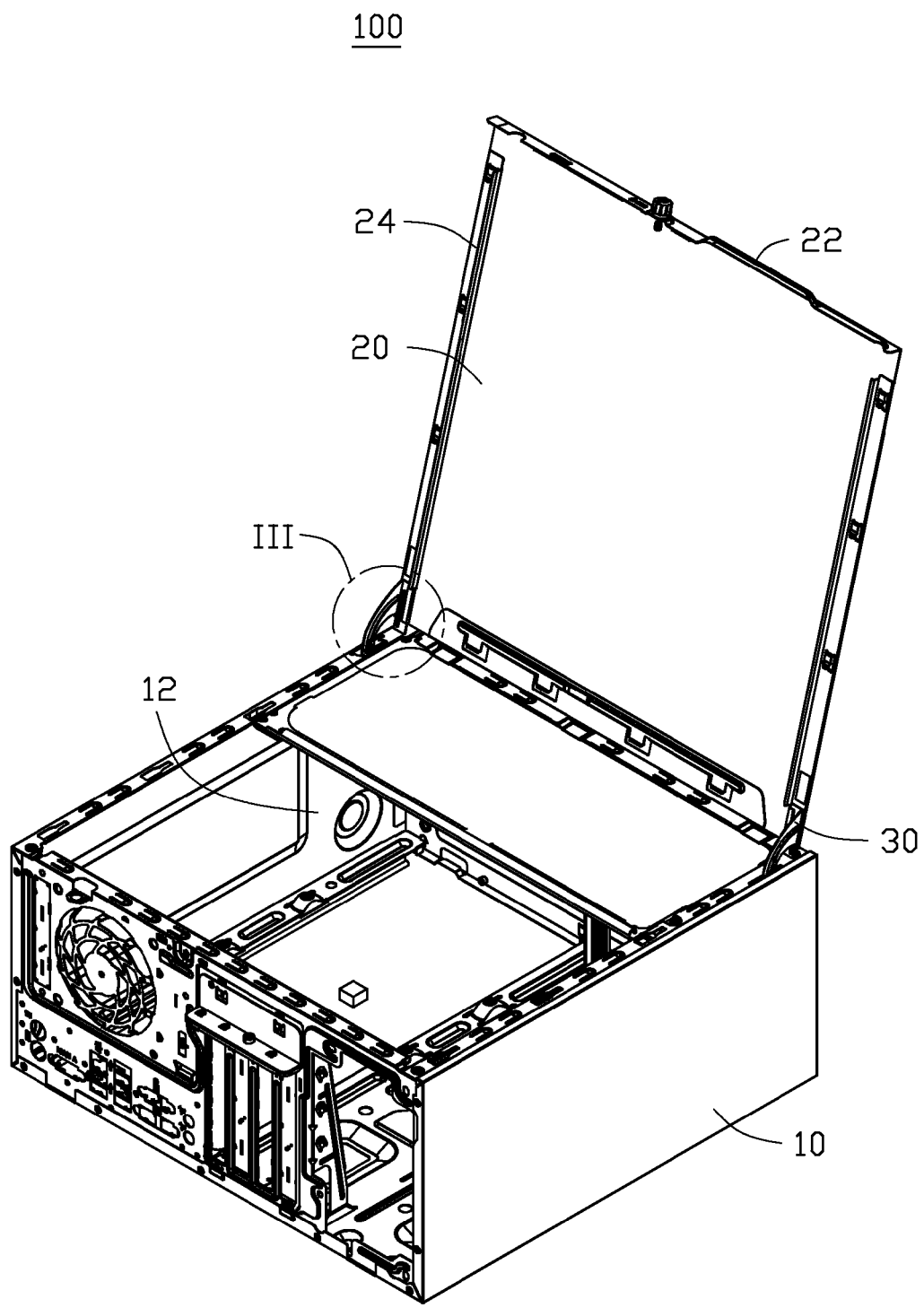
FIG. 2 is an isometric view of the server case with a door opened.
Figure 3:
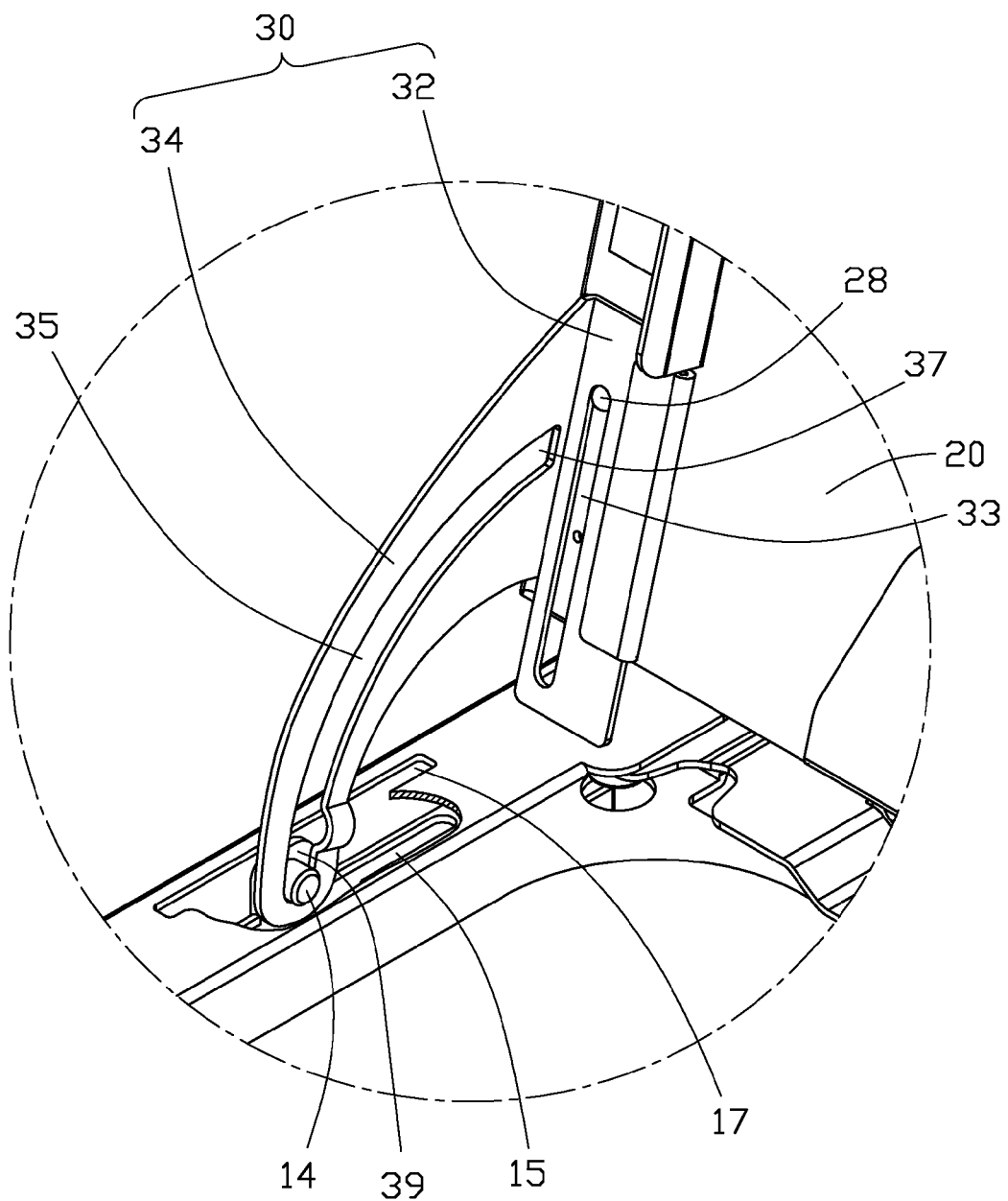
FIG. 3 is an enlarged view of the circled portion III of FIG. 2.

FIGS. 1 and 2 illustrate a server case 100 includes a shell 10, a door 20 and two connection members 30. The shell 10 defines an opening 12. FIG. 3 illustrates the connection member 30 includes a sliding portion 32 and a rotation portion 34. The sliding portion 32 is slidable and connects to the door 20. The rotation portion 34 is slidably engaged with the shell 10. When the sliding portion 32 slides on the door 20 from a first position to a second position, the rotation portion 34 slides in the shell 10 from a first position to a second position to drive the door 20 from a first state in which the door 20 is supported at an angle between the door 20 and the opening 12 greater than 90 degrees to a second state in which the door shields the opening 12.

Figure 4:
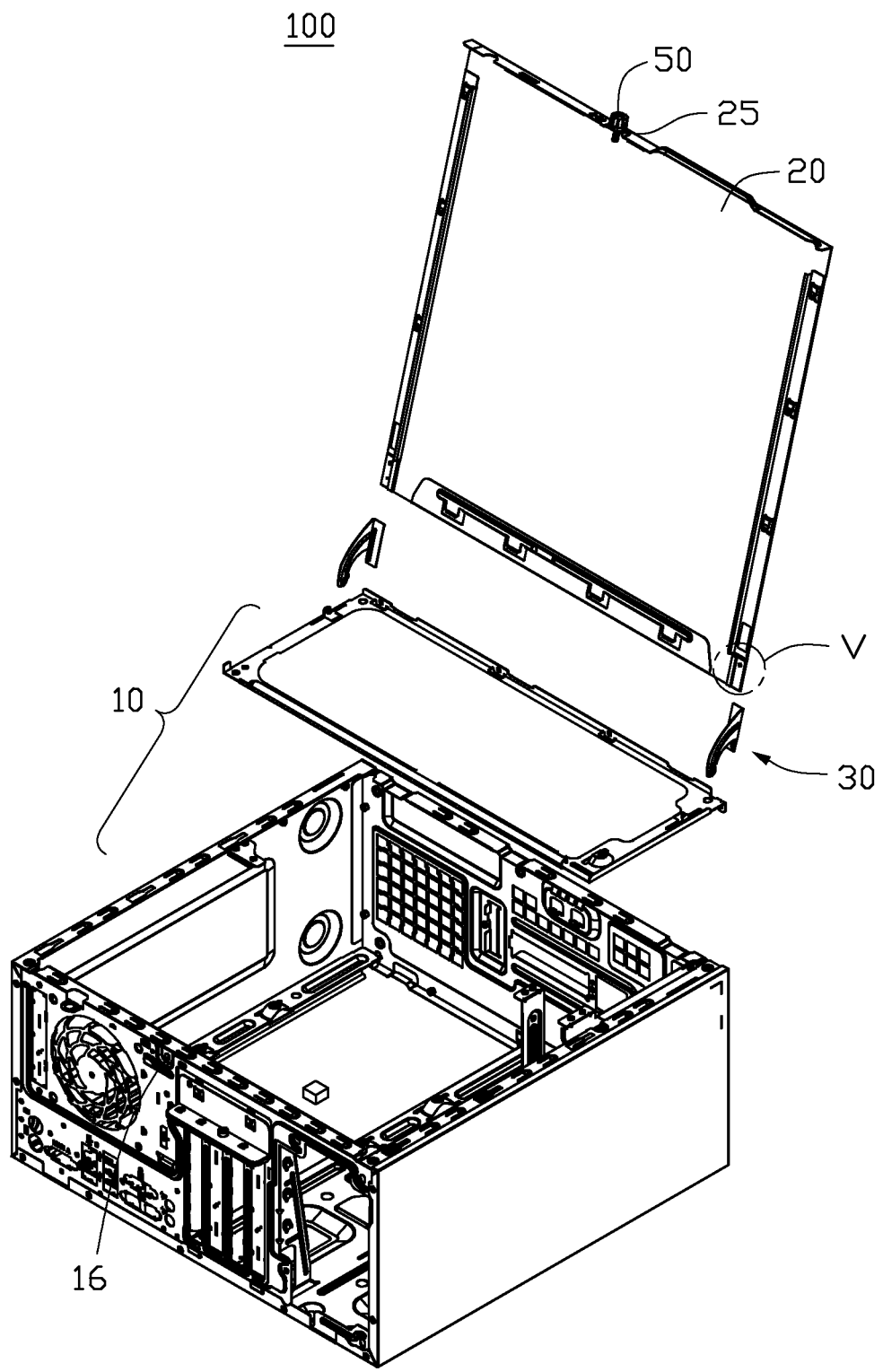
FIG. 4 is an exploded, isometric view of the server case in FIG. 2.
Figure 5:
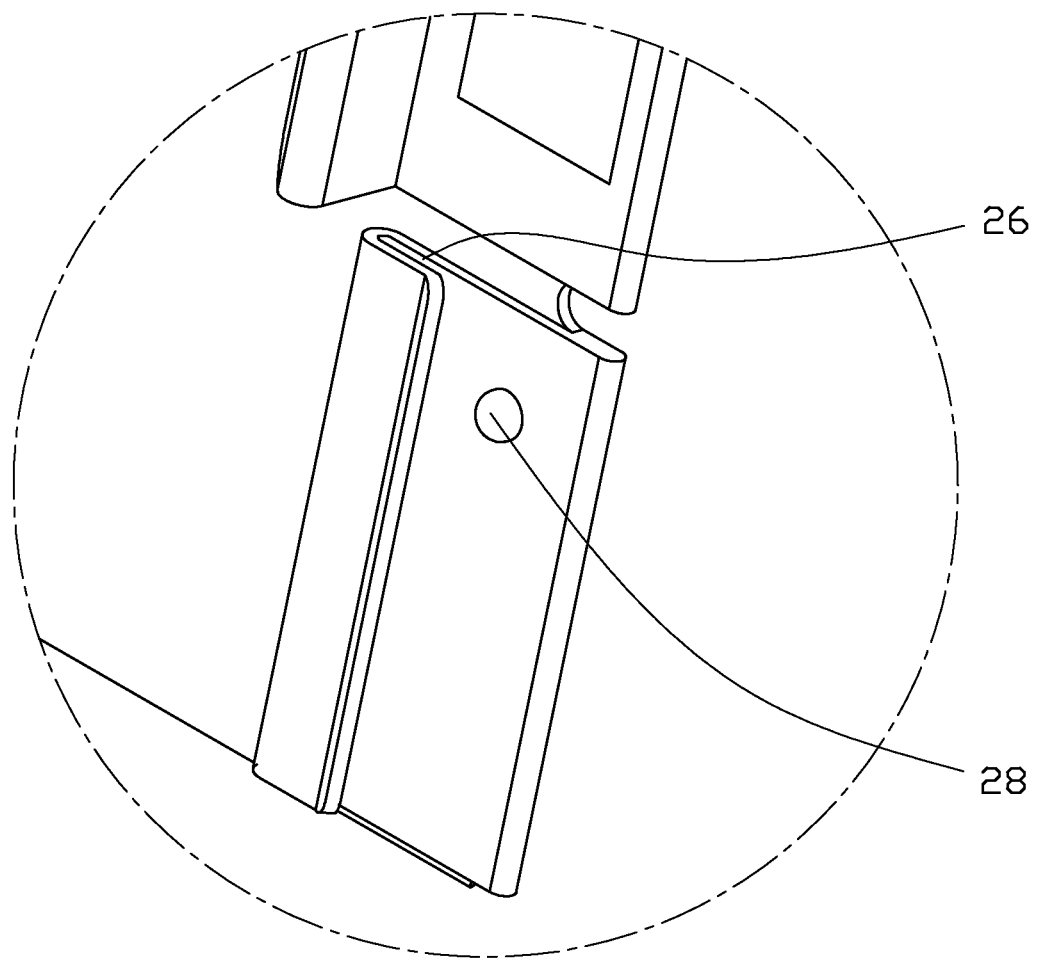
FIG. 5 is an enlarged view of the circled portion V of FIG. 4.
Figure 6:
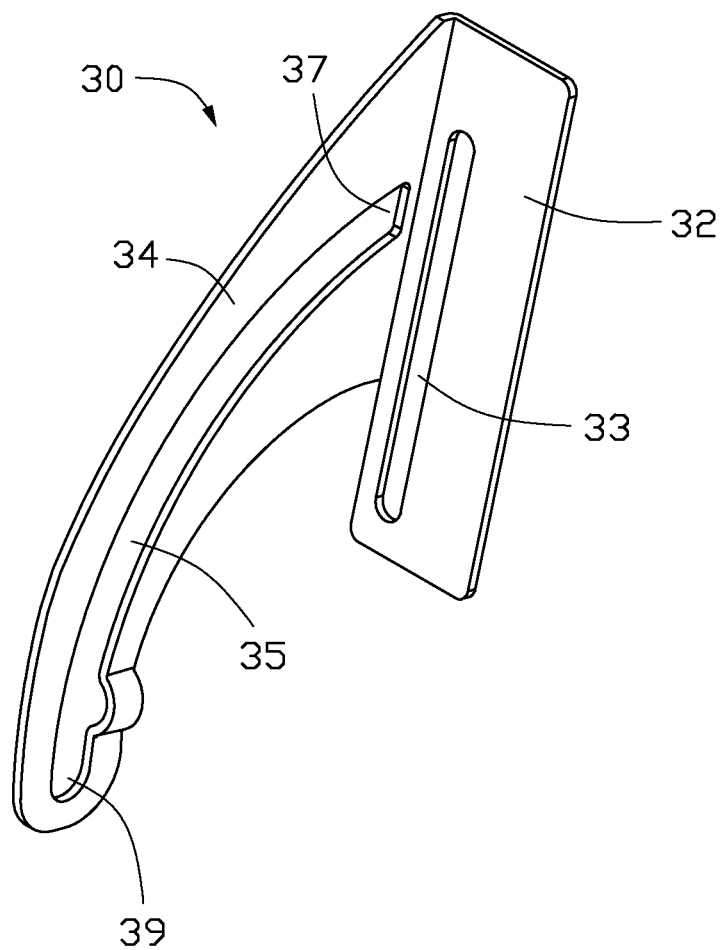
FIG. 6 is an enlarged view of a connection member of the server case in FIG. 4.

The door 20 includes two opposite first flanges 22 and two opposite second flanges 24 connecting the two opposite first flanges 22. The first flange 22 is parallel to the opening 12. FIGS. 4 and 5 illustrate a sliding groove 26 is defined at an inner side of the door 20. An extended direction of the sliding groove 26 is parallel to the second flange 24. The sliding groove 26 is "U" shaped. A stop member 28 protrudes from the door 20 and is adjacent to the sliding groove 26. FIGS. 3 and 6 illustrate the sliding portion 32 defines a restriction groove 33 parallel to the sliding groove 26. The sliding portion 32 is slidable and received in the sliding groove 26. The stop member 28 is received in the restriction groove 33.

The rotation portion 34 is perpendicularly attached to the sliding portion 32. The rotation portion 34 defines an arc rotation groove 35. The rotation groove 35 includes a start end 37 adjacent to the sliding portion 32 and a distal end away from the sliding portion 39. The start end 37 is positioned above the distal end 39.

Figure 7:
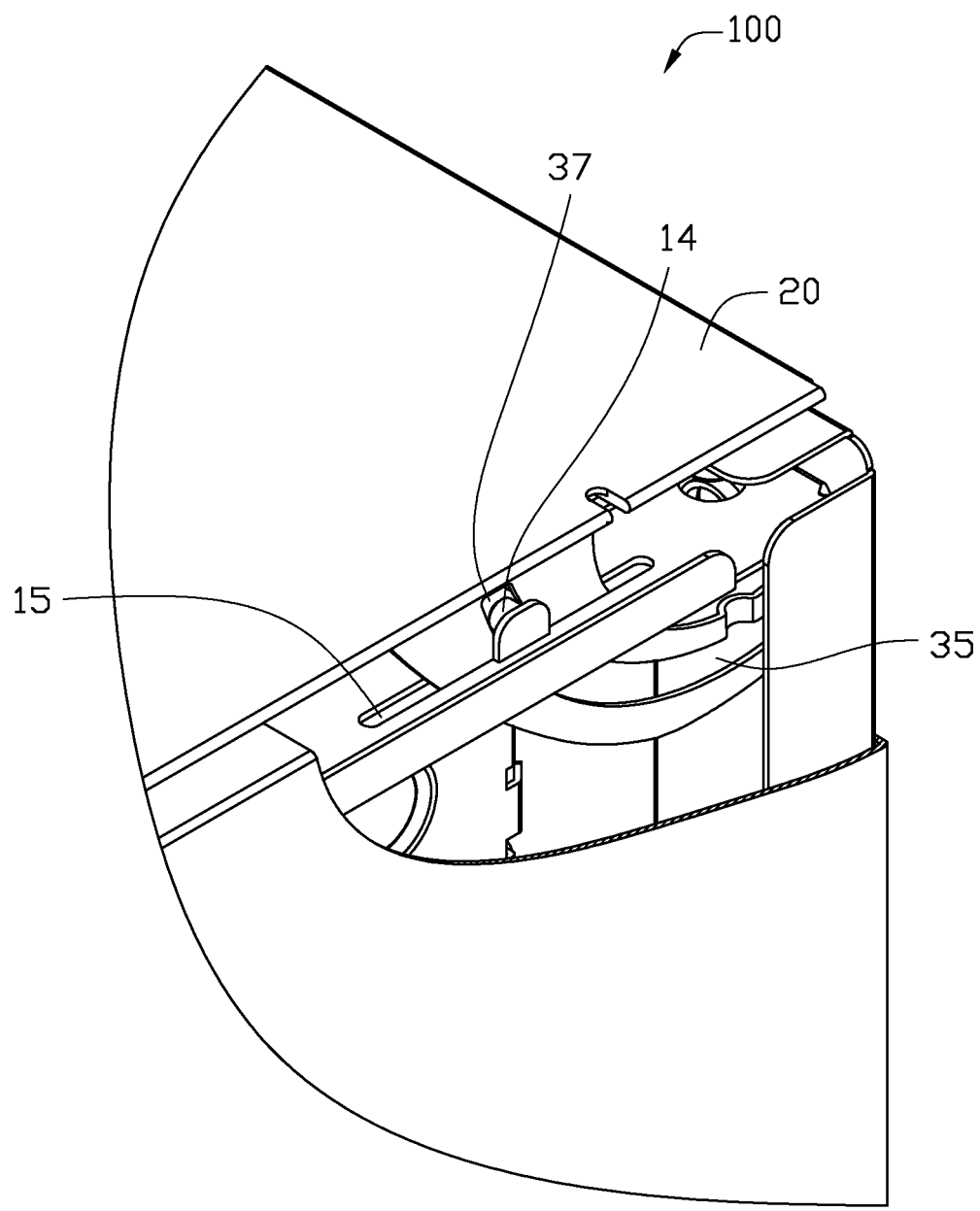
FIG. 7 is a partial, cross-sectional view of the server case in FIG. 1.
Figure 8:
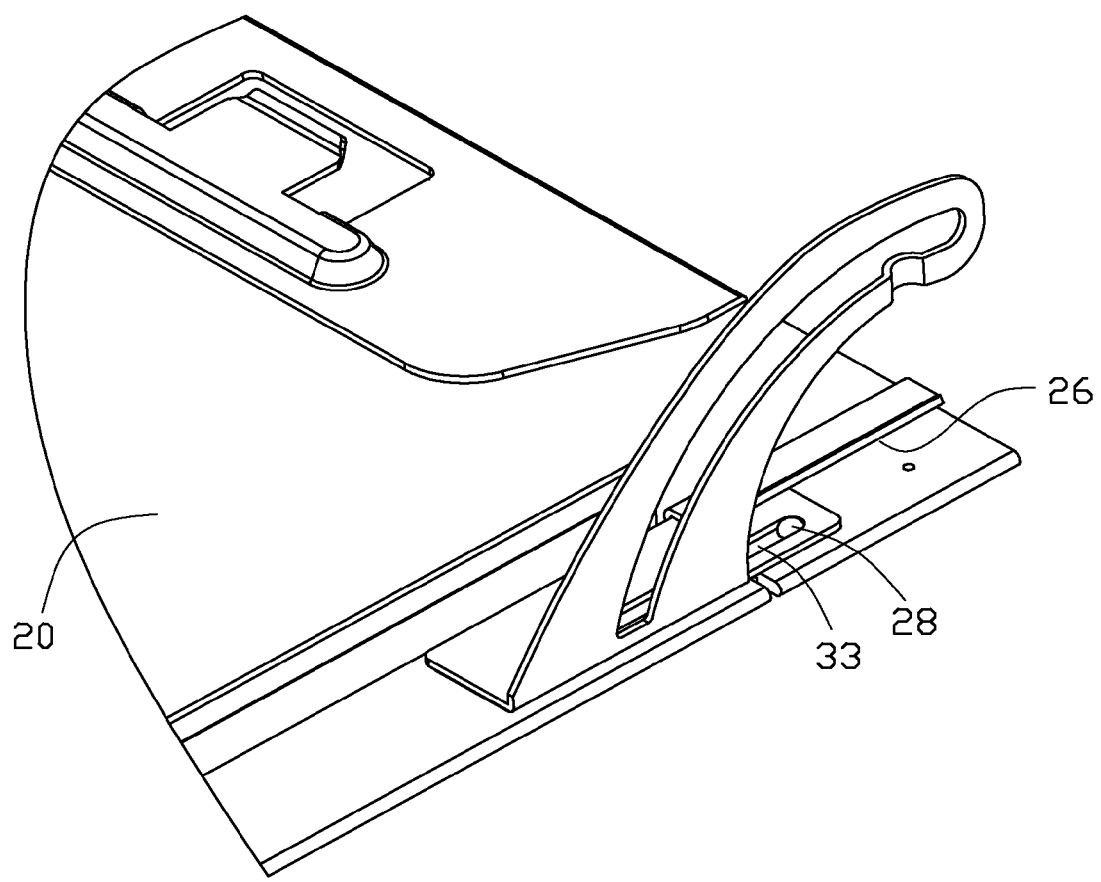
FIG. 8 is an isometric view of the connection member of the server case in FIG. 1.

Two rotation shafts 14 are attached to the shell 10. The rotation shaft 14 is perpendicular to the rotation groove 35 and is received in the rotation groove 35. When the door 20 is supported in the first state, the stop member 28 is received in an end of the restriction groove 33 away from the shell 10, the rotation shaft 14 is received in the distal end 39 of the rotation groove 35. Therefore, the angle between the door 20 and the opening 12 cannot continue to increase under a pulling force of the sliding portion 32 and the rotation shaft 14. The door 20 is supported in the first state. FIGS. 7 and 8 illustrate when shielding the opening 12, the door 20 is rotated, the rotation portion 32 slides in the sliding groove 26 to move the stop member 28 from the end of the sliding groove 26 away from the shell 10 to the other end of the sliding groove 26. Correspondingly, the rotation portion 34 engages with the shell 10 to move the rotation shaft 14 from the distal end 39 of the rotation shaft 35 to the start end 37 of the rotation groove 35 to pull the door 20 to shield the opening 12.

The shell 10 further defines a threaded hole 16. The door 20 defines a through hole 25. When the door 20 shields the opening 12, a bolt 50 passes through the through hole 25 to screw in the threaded hole 16 to secure the door 20 to the shell 10.

Figure 9:
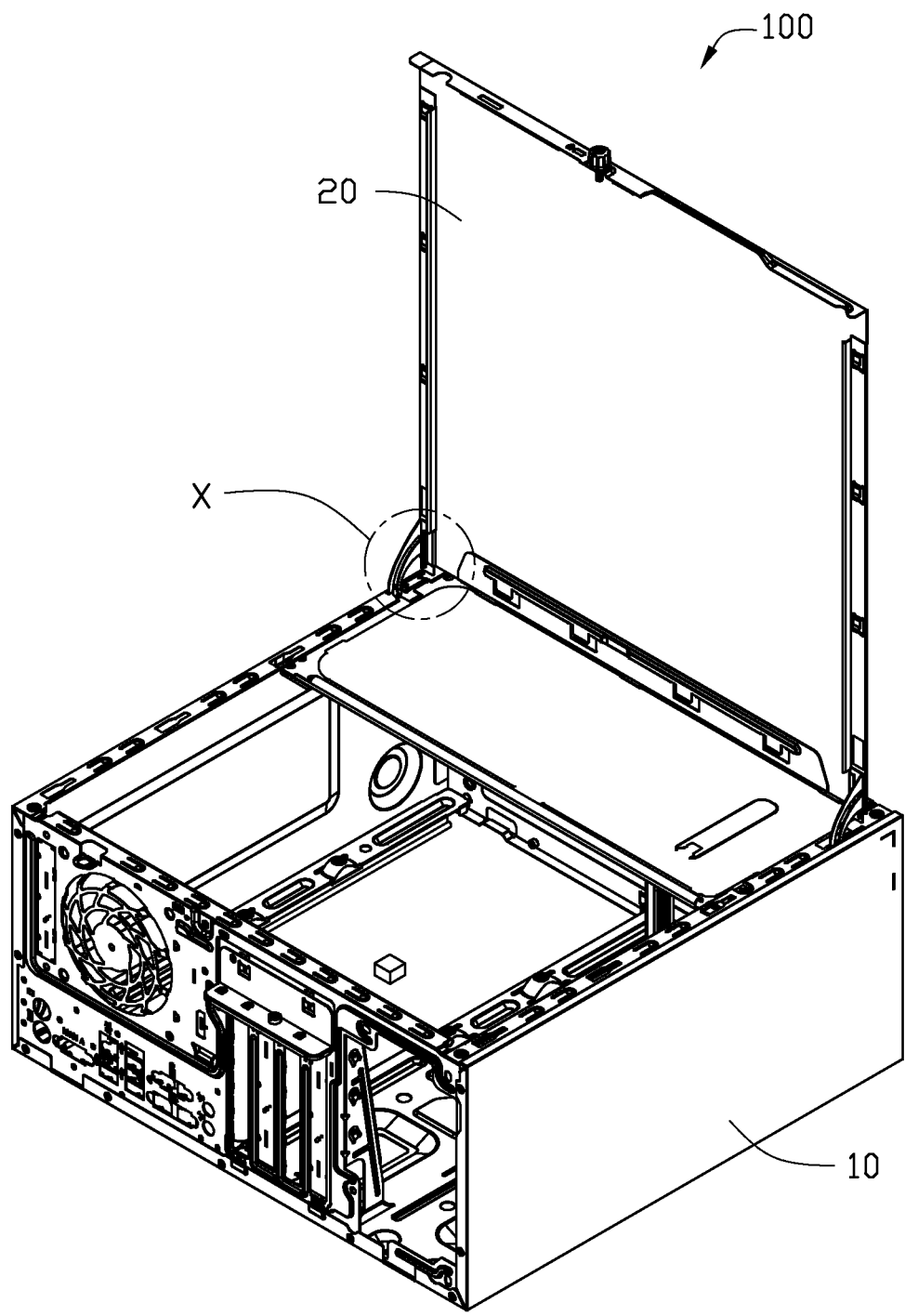
FIG. 9 is an isometric view of the server case in FIG. 1 when assembling the connection member.
Figure 10:
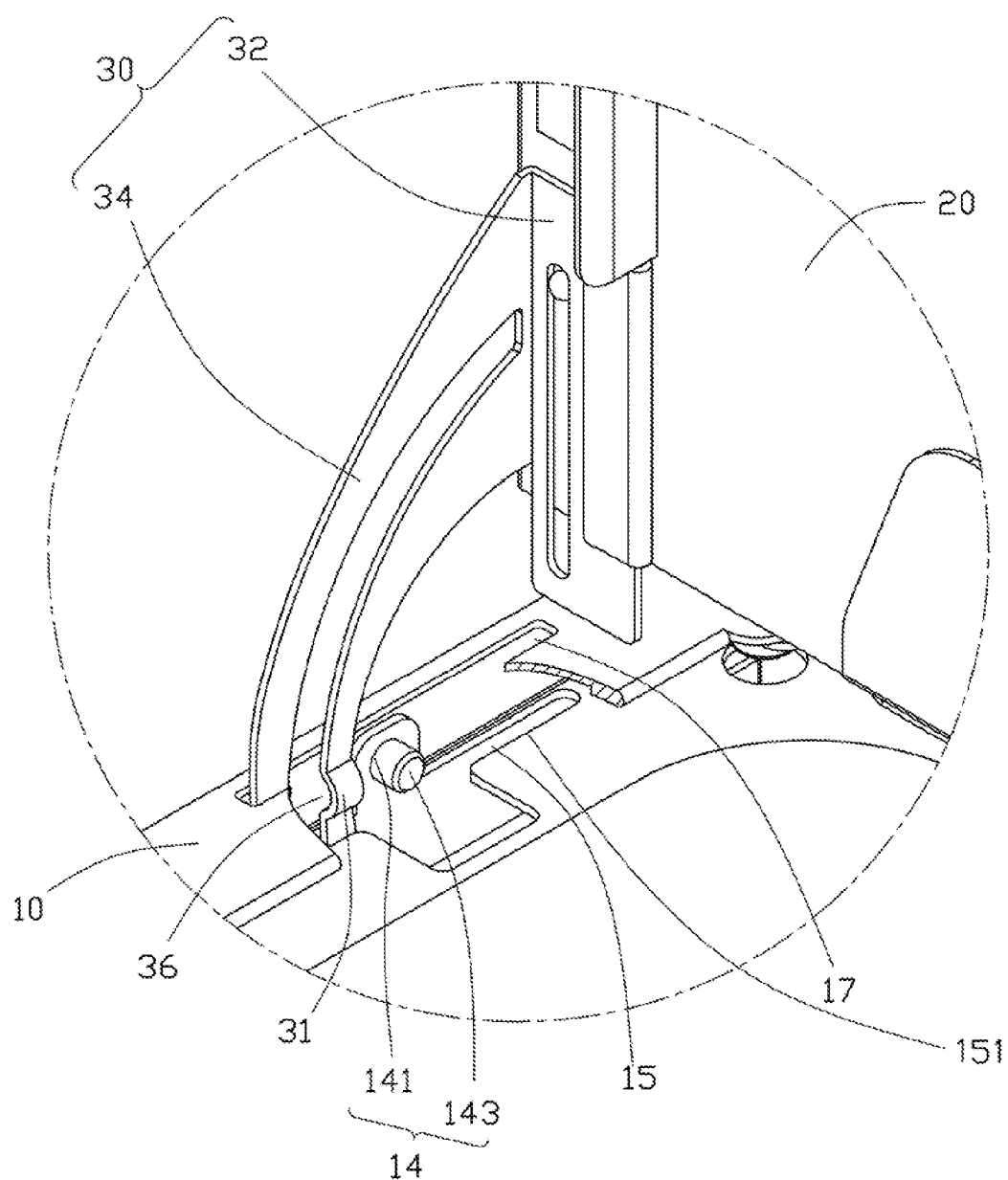
FIG. 10 is an enlarged view of the circled portion X of FIG. 9.

FIGS. 9 and 10 illustrate the shell 10 further defines two first slots 15 and two second slots 17 positioned above the two first slots 15. The rotation shaft 14 is positioned between the first slot 15 and the second slot 17. The rotation shaft 14 includes a fixing end 141 fixed to the shell 10 and a free end 143. The free end 143 projects in a direction perpendicular to the first slot 15 and is within the first slot 15, and a distance between the free end 143 and a lateral edge 151 of the first slot 15 away from the fixing end 141 is less than the thickness of the rotation portion 34. Therefore, the rotation shaft 14 prevents the rotation portion 34 from moving away from the first slot 15. A protrusion 31 protrudes from the rotation portion 34. The protrusion 31 defines a gap 36. The gap 36 is opposite to the rotation shaft 14 and communicates with the rotation groove 35. When assembling the rotation portion 34, an end of the rotation portion 34 adjacent to the distal end 39 passes through the second slot 17 to be received in an end of the first slot 15 away from the sliding portion 32, to align gap 36 with the rotation shaft 14, the rotation portion 34 is moved toward the sliding portion 32 to make the rotation shaft 14 cross the gap 36 to be received in the rotation groove 35. Therefore, the rotation portion 34 sleeves on the rotation shaft 14.

The embodiments shown and described above are only examples. Even though numerous characteristics and advantages of the present technology have been set forth in the foregoing description, together with details of the structure and function of the present disclosure, the disclosure is illustrative only, and changes may be made in the details, including in matters of shape, size, and arrangement of the parts within the principles of the present disclosure, up to and including the full extent established by the broad general meaning of the terms used in the claims.

What is claimed is:

1. A server case comprising:
a shell defining an opening;
a door configured to cover the opening of shell and shield contents of the server case inside the shell; and
a connection member comprising a sliding portion and a rotation portion, the sliding portion slidably connects to the door, the rotation portion slidably engages with the shell, a stop member protrudes from the door, a restriction groove is defined in the sliding portion, the stop member is received in the restriction groove; the sliding portion slides on the door to drive the rotation portion to slide in the shell to make the door rotate between an open position, where a first angle between the door and the opening is greater than 90 degrees, and a shielding position, where a second angle between the door and the opening is an acute angle.

2. The server case as claimed in claim 1, wherein a sliding groove is defined in an inner side of the door and the sliding portion is slidably received in the sliding groove.

3. The server case as claimed in claim 2, wherein the door comprises two first flanges and two second flanges, the two second flanges being perpendicular to the two first flanges, the first flanges are parallel to an edge of the shell about which the door rotates, an extended direction of the sliding groove is parallel to the second flange.

4. The server case as claimed in claim 2, wherein the sliding groove is "U" shaped.

5. The server case as claimed in claim 3, wherein an arc rotation groove is defined in the rotation portion, a rotation shaft is attached to the shell, the rotation shaft is received in the rotation groove.

6. The server case as claimed in claim 5, wherein the rotation shaft is perpendicular to the rotation groove.

7. The server case as claimed in claim 5, wherein the rotation groove comprises a start end adjacent to the sliding portion and a distal end positioned away from the sliding portion, the start end is positioned above the distal end.

8. The server case as claimed in claim 7, wherein when the door is supported in the first angle greater than 90 degrees, the stop member is received in an end of the restriction groove away from the shell, the rotation shaft is received in the distal end of the rotation groove, and wherein when the door shields the opening, the stop member is received in another end of the restriction groove, the rotation shaft is received in the start end of the rotation groove.

9. The server case as claimed in claim 5, wherein a first slot is defined in the shell, the rotation shaft is positioned above the first slot, the rotation shaft comprises a fixing end fixed to the shell and a free end aligning vertically with the first slot, the free end projects outward in direction perpendicular to the first slot a length of, wherein the free end vertically aligns with a space defined by the first slot, and a distance between the free end and a lateral edge of the first slot away from the fixing end is less than a thickness of the rotation portion.

10. The server case as claimed in claim 9, wherein a protrusion protrudes from the rotation portion, the protrusion defines a gap, the gap is opposite to the rotation shaft and intercommunicates with the rotation groove.

11. A server case comprising:
a shell defining an opening;
a door configured to cover the opening of the shell and shield contents of the server case inside the shell; and
a connection member comprising a sliding portion and a rotation portion, the sliding portion slidably connects to the door, the rotation portion slidably engages with the shell, a stop member protrudes from the door, the sliding portion defines a restriction groove, the stop member is received in the restriction groove; the rotation portion configured to rotate in the shell following the sliding portion sliding on the door, wherein when the sliding portion slides to a first limit position, the rotation portion slides to a corresponding first limit position, and the door rotates between an open position, where an angle between wherein the door and the opening is greater than 90 degrees, and a shielding position, where the door shields the opening.

12. The server case as claimed in claim 11, wherein a sliding groove is defined in an inner side of the door and the sliding portion is slidably received in the sliding groove.

13. The server case as claimed in claim 12, wherein the door comprises two first flanges and two second flanges, the two second flanges being perpendicular to the two first flanges, the first flanges are parallel to an edge of the shell about which the door rotates, an extended direction of the sliding groove is parallel to the second flange.

14. The server case as claimed in claim 12, wherein the sliding groove is "U" shaped.

15. The server case as claimed in claim 13, wherein an arc rotation groove is defined in the rotation portion, a rotation shaft is attached to the shell, the rotation shaft is received in the rotation groove.

16. A case comprising:
a shell defining a receiving space with a defined opening;
a cover door positionable to substantially cover the defined opening; and
one or more connection members, each connection member having a sliding portion, slidably connected to the cover door, and a rotation portion, slidably engaged with the shell; a stop member protrudes from the cover door, the sliding portion defines a restriction groove, the stop member is received in the restriction groove;
wherein, the cover door is rotatable between a first open position, where an angle between the cover door and the defined opening is greater than 90 degrees, and a shielding position, where a second angle between the cover door and the defined opening is an acute angle.

17. The case as claimed in claim 16, wherein a sliding groove is defined in an inner side of the cover door and the sliding portion is slidably received in the sliding groove.

18. The case as claimed in claim 17, wherein the cover door comprises two first flanges and two second flanges the two second flanges being perpendicular to the two first flanges, the first flanges are parallel to an edge of the shell about which the cover door rotates, an extended direction of the sliding groove is parallel to the second flange.

19. The case as claimed in claim 18, wherein the rotation portion defines an arc rotation groove, a rotation shaft is attached to the shell, the rotation shaft is received in the rotation groove.

20. The case as claimed in claim 19, wherein the rotation groove comprises a start end adjacent to the sliding portion and a distal end away from the sliding portion, the start end is positioned above the distal end.

* * * * *